(12) United States Patent
Severac et al.

(10) Patent No.: US 12,306,054 B2
(45) Date of Patent: May 20, 2025

(54) TOUCH SURFACE FUNCTIONALIZED BY A COMBINED FORCE AND PROXIMITY SENSOR

(71) Applicant: NANOMADE LAB, Toulouse (FR)

(72) Inventors: Fabrice Severac, Toulouse (FR); Nicolas Dufopur, Vallegue (FR)

(73) Assignee: NANOMADE LAB, Toulouse (FR)

( * ) Notice: Subject to any disclaimer, the term of this patent is extended or adjusted under 35 U.S.C. 154(b) by 312 days.

(21) Appl. No.: 17/801,249

(22) PCT Filed: Mar. 1, 2021

(86) PCT No.: PCT/EP2021/055082
§ 371 (c)(1),
(2) Date: Aug. 21, 2022

(87) PCT Pub. No.: WO2021/170883
PCT Pub. Date: Sep. 2, 2021

(65) Prior Publication Data
US 2022/0412820 A1    Dec. 29, 2022

(30) Foreign Application Priority Data

Feb. 28, 2020 (FR) ........................ 2002055

(51) Int. Cl.
*G01L 1/22* (2006.01)
*B60K 35/00* (2006.01)
*G01D 5/24* (2006.01)
*G06F 3/01* (2006.01)
*G06F 3/041* (2006.01)
(Continued)

(52) U.S. Cl.
CPC ............ *G01L 1/2293* (2013.01); *B60K 35/00* (2013.01); *G01D 5/24* (2013.01); *G06F 3/016* (2013.01); *G06F 3/0414* (2013.01); *G06F 3/04164* (2019.05); *G06F 3/0447* (2019.05); *H03K 17/962* (2013.01); *B60K 35/10* (2024.01); *B60K 35/25* (2024.01); *B60K 2360/143* (2024.01); *B60K 2360/1438* (2024.01);
(Continued)

(58) Field of Classification Search
CPC . G01L 1/2293; G06F 3/04164; G06F 3/0447; G06F 3/0414
See application file for complete search history.

(56) References Cited

U.S. PATENT DOCUMENTS 10,871,867 B1 * 12/2020 Banss .................... G06F 3/0447
2002/0149571 A1 * 10/2002 Roberts ............... G06F 3/04142
345/173
(Continued)

*Primary Examiner* — Eric S. McCall

(57) ABSTRACT

The invention relates to a touch surface comprising:
  a carrier substrate (510, 610) comprising 2 opposite faces (511, 512) one (511) of the faces being exposed to touch;
  and comprising on the face (512) opposite the face (511) exposed to touch, a combined proximity and force sensor (300) comprising:
  an insulating substrate (210); —conductive tracks (221, 222) deposited on said substrate (210) and configured to produce a capacitive sensor;
  a force sensor (230) consisting of an assembly of conductive nanoparticles in colloidal suspension in an electrically insulating ligand;
  a protective layer (310) covering the conductive tracks and the nanoparticle assembly.

The invention also relates to a method for detecting and measuring the force applied by a touch against such a touch surface.

11 Claims, 7 Drawing Sheets

(51) Int. Cl.
*G06F 3/044* (2006.01)
*H03K 17/96* (2006.01)
*B60K 35/10* (2024.01)
*B60K 35/25* (2024.01)

(52) U.S. Cl.
CPC .. *B60K 2360/332* (2024.01); *B60K 2360/336* (2024.01); *B60K 2360/34* (2024.01); *G06F 2203/04105* (2013.01)

(56) References Cited

U.S. PATENT DOCUMENTS

| | | |
|---|---|---|
| 2004/0239474 A1 | 12/2004 | Dunn et al. |
| 2013/0181726 A1* | 7/2013 | Viallet .................. G01L 1/205 |
| | | 324/661 |
| 2015/0091859 A1 | 4/2015 | Rosenberg et al. |
| 2015/0268692 A1 | 9/2015 | Benoit et al. |
| 2017/0220162 A1 | 8/2017 | Ko et al. |
| 2021/0239546 A1* | 8/2021 | Severac .................. G01L 1/20 |

* cited by examiner

TOUCH SURFACE FUNCTIONALIZED BY A COMBINED FORCE AND PROXIMITY SENSOR

RELATED APPLICATIONS

This application is a § 371 application of PCT/EP2021/055082 filed Mar. 1, 2021, which claims priority from French Patent Application No. 2002055 filed Feb. 28, 2020, each of which is incorporated herein by reference in its entirety.

FIELD OF THE INVENTION

The invention belongs to the field of sensors called touch sensors, more particularly sensors in the form of a film, applicable to flexible or rigid surfaces and capable of detecting the proximity of an object and the touch of the sensor by this object, as well as the applied force.

The invention relates more particularly, but not exclusively, to a flexible and easily deformable touch surface, such that it may result from the functionalization of a flexible material such as a textile or leather, on clothing, clothing accessories, or furniture upholstery, without these examples being limiting.

The invention is however perfectly applicable to the functionalization of rigid or semi-rigid touch surfaces.

BACKGROUND OF THE INVENTION

The sensors in the form of a film capable of detecting the proximity or the contact of an object, such as a finger or a stylus, are commonly used on computer, smartphone or computer tablet screens.

Two technologies are mainly used for this purpose: the capacitive detection and the resistive detection.

The capacitive detection detects the presence of an hovering object at a short distance from the sensor, by changing the capacitance of an electrical circuit due to the presence of this object.

The resistive detection detects the contact of an object on the screen, by the deformation of an upper layer of the screen, the deformation being detected by strain gauges or more simply by closing electric microcontacts under the effect of this distortion.

Thus these sensors allow detecting a touch according to a sufficient force, but generally do not allow characterizing this force, that is to say measuring its intensity, it is an all or nothing detection.

The capacitive sensors can also be used to detect a touch. To the extent that the capacitance variation is a function of the distance between the object and the sensor, a zero distance, that is to say a touch, is, at least in theory, detectable, as exposed in the document WO 2015/038842.

However, this is once again an all or nothing type detection, which does not allow quantifying the intensity of the applied force.

In order to improve the interactivity of the objects provided with such sensors and increase the functionalities that can be activated via a touch interaction with their user, it is useful to associate, on the same screen, tactile detection combining proximity detection and touch detection.

For example, the proximity detection allows detecting fast movements of the fingers to navigate through menus, while the detection of the touch (with a certain force) allows triggering an action according to a navigation principle called "peek and pop".

Advantageously, different actions can be triggered depending on the force of application at the same point.

In order to mention only a few examples, the quantification of the touch force is also useful in applications of the graphics tablet type to mimic the response that a pencil or a brush would have depending on the force of application of the stylus.

Thus, the functionalities of proximity detection as well as detection and measurement of contact force are, for such applications, in a profound synergy.

The document WO 2014/018118 uses an ultrasound device, generated by a plurality of piezoelectric elements distributed over a touch surface in order to detect a proximity, a contact (touch), and the intensity of this contact. However, the implementation of such a device requires a substantial consumption of energy to activate the different ultrasonic devices and due to the superposition of the different systems, the touch surface is relatively thick.

The document EP 2 877 911 describes a method for producing a transparent touch surface comprising a network of strain gauges made of assemblies of nanoparticles, capable of measuring the force applied to each of said strain gauges. The gauges thus created have a sensitivity which is several thousand times greater than a conventional strain gauge.

However, if such a touch surface is capable of detecting a touch in terms of point of application and intensity of pressure, it does not allow detecting a simple proximity.

In addition, the electrical properties of the force microsensors used in this example of the prior art are also sensitive to environmental factors, such as temperature, producing a drift, and the information they deliver is also subject to hysteresis phenomena.

FIG. 1, relating to the prior art, shows an example of information, in voltage (102), delivered as a function of time (101) by such a force sensor consisting of an assembly of conductive or semi-conductive nanoparticles in colloidal suspension in an insulating ligand, when a force is applied to said sensor, for example a touch.

According to this example, the touch is applied between times $t_0$ and $t_1$.

The intensity of the force is proportional to the difference $(V_1 - V_0)$, however, if $V_1$ is measurable, the knowledge of $V_0$ is essential to determine the intensity of the force.

This value $V_0$ depends on environmental factors and is likely to vary over time, in particular with temperature.

In order to overcome this difficulty, the document WO 2018/130672 describes a drift compensation device with the use of reference resistors and a Wheatstone half-bridge mounting.

This solution implies a more complex installation and does not solve the hysteresis phenomena (103), where the sensor continues to deliver information after the time $t_1$ when the force is no longer applied.

This hysteresis phenomenon is troublesome for applications where high reactivity of the touch surface is desired.

In addition, when the touch surface results from the functionalization of a flexible material, the force sensor is capable of delivering an information depending on the deformation of the material, for example due to the wrinkling of a textile, the tightening of a wristband or a belt . . . Such a situation poses difficulties in the processing of the information, on the one hand, this deformation creates an offset value similar to $V_0$ mentioned above, on the other hand, the variation of the information with this deformation can be confused with a voluntary action of touching, and in turn trigger processes provided by this action, but involuntary for the user.

Finally, the touch surfaces functionalized on common objects (clothing, furniture, wristband, etc.) may be the subject of contact or inadvertent touches by their user, likely to be confused with a voluntary action thereof.

The document US 2015/0091859 describes a combined sensor comprising proximity sensors and force sensors. If the sensor disclosed in this document in the form of a stack of layers, comprises a relatively deformable layer in its thickness, acting as a test body between the surface exposed to the touch and the force sensor, said stack is always installed on a rigid support, not necessarily flat, but stable in terms of form. Thus, the device disclosed in this document is not suitable for the functionalization of the surface of a flexible material, The document US 2017/0220162 describes a combined sensor intended essentially for the functionalization of a display screen, which sensor combines a capacitive proximity sensor and a resistive force sensor. As for the device described in the document mentioned above, this combined sensor implements a deformable layer in its thickness exposed to the touch, and bears on a rigid support, therefore is not suitable for the functionalization of the surface of a soft material.

OBJECT AND SUMMARY OF THE INVENTION

The invention aims at solving the drawbacks of the prior art and relates to this end, according to a first embodiment, to a touch surface comprising:
  a carrier substrate comprising 2 opposite faces, one of the faces being exposed to touch;
  and comprises, on the face which is opposite to the face exposed to touch, a combined proximity and force sensor comprising:
  an insulating substrate;
  conductive tracks deposited on said substrate, configured to produce a capacitive sensor;
  a force sensor consisting of an assembly of conductive or semi-conductive nanoparticles in colloidal suspension in a ligand which is electrically insulating and deposited on said substrate;
  conductive tracks (240) deposited on the substrate to supply power and collect information from the sensors thus formed;
  a protective layer covering the conductive tracks and the nanoparticle assembly.

According to a second embodiment, the touch surface of the invention comprises:
  a carrier substrate comprising 2 opposite faces, one of the faces being exposed to touch;
  and comprises, on the face which is opposite to the face exposed to touch, a combined proximity and force sensor comprising:
  a first assembly comprising a first insulating substrate, on which is deposited a force sensor consisting of an assembly of conductive or semi-conductive nanoparticles in colloidal suspension in an electrically insulating ligand;
  a second assembly, superimposed on this first assembly, comprising a second insulating substrate on which conductive tracks, configured to produce a capacitive sensor, are deposited;
  conductive tracks deposited on the respective substrates to supply power and collect information from the sensors thus formed;
  a protective layer covering the two sets.

Thus, regardless of the embodiment, these devices of the invention take advantage of the high sensitivity of the force sensors based on the tunnel effect, to directly functionalize the surface of the carrier substrate, whether flexible or rigid, without requiring said carrier substrate to be fixed on a rigid base and without requiring the presence of a deformable layer in the thickness to carry out this functionalization.

This advantage has the drawback of the drift and hysteresis phenomena associated with this type of sensor, and when the carrier substrate is flexible, the influence of the deformation thereof on the measurements. The association of the proximity sensors allows overcoming these difficulties by implementing the method which is also part of the invention.

Thus, the invention also relates to a method for detecting and measuring the intensity of a touch force by an electrically conductive object on a touch surface, which method implements a combined elementary sensor according to the invention, regardless of its embodiment, and which comprises steps consisting in:
  i. adjusting the sensitivity of the capacitive sensor so as to detect a defined distance between said sensor and a conductive object;
  ii. when the conductive object is detected by the capacitive sensor, at a distance which is less than or equal to the distance defined in i), measuring the conductivity of the force sensor and taking the value thus measured as a reference value $V_0$;
  iii. when a force is applied by means of the object, measuring the conductivity $V_1$ of the force sensor under the action of this force and deducing the intensity of the force therefrom by difference with the reference value $V_0$ determined in ii) ($V_1-V_0$) and outputting the value of this intensity;
  iv. when the support of the object on the surface is released and the distance detected by the capacitive sensor becomes greater than or equal to the distance determined in i), outputting a force intensity value equal to 0.

To the extent that any touch of the surface necessarily implies that the object making the contact with said surface moves towards and away from the surface, the judicious selection of the distance in step i) allows detecting the imminence of a contact then the moment of its release, so as to correct and eliminate the phenomena of drift, hysteresis or preload of the force sensor.

Thus, the force sensor and the capacitive sensor, where appropriate deposited on the same substrate, cooperate to provide a detection and a reliable measurement of the touch force, allowing the production of a device which is thinner and easier to produce than the examples of the prior art providing the same functionalities, and which moreover is adaptable to a carrier substrate made of a flexible material.

The invention is advantageously implemented according to the embodiments and variants set out below, which are to be considered individually or according to any technically effective combination.

According to a first variant, the carrier substrate is made of a flexible material.

This variant allows, for example, functionalizing a surface on an item of clothing or on the upholstery of a piece of furniture.

Advantageously, the flexible material is selected from a textile of natural or synthetic fibers, a polymer membrane, paper, leather or any combination of these materials.

According to this variant, the combined sensor advantageously comprises a plurality of capacitive sensors and a plurality of force sensors, the number of force sensors being substantially equal to the number of capacitive sensors.

Thus, the determination of the intensity of the touch force by the cooperation of the proximity and force sensors is more accurate on a deformable carrier substrate made of flexible material.

According to a second variant, the carrier substrate is made of a rigid material selected from wood, glass, ceramic, or any combination of these materials.

According to this second variant, the touch surface comprises a plurality of capacitive sensors and a plurality of force sensors, the total number of capacitive sensors is greater than the number of force sensors.

This embodiment is economical by allowing using fewer force sensors with equivalent functionality.

According to an exemplary embodiment, the substrate of the combined sensor is made of polyimide, alternatively the substrate of the combined sensor is made of PET (Polyethylene Terephthalate) for the production of a transparent sensor.

According to an exemplary embodiment, the force sensor consists of nanoparticles of tin-doped indium oxide ($In_2O_3$—$SnO_2$) (ITO), in an (aminomethyl) phosphonic acid ligand and the conductive tracks are made of ITO.

Thus the sensor is transparent.

According to one embodiment of the method of the invention, implementing a touch surface in which the number of capacitive sensors is greater than the number of force sensors, step ii) of the method comprises determining the location, on the touch surface, of the point of application of the touch depending on the capacitive sensor where the minimum distance is detected, measuring the conductivity of each of the force sensors at this time and resetting the information they deliver depending on the value thus measured, and step iii) comprises determining the applied effort by combining the information from the force sensors depending on the location of the point of application determined in step ii).

Thus, by the cooperation between the capacitive sensors and the force sensors, the force applied at a point of the touch surface is measured even if the density of force sensors is lower than the density of capacitive sensors.

Advantageously, the method of the invention comprises the steps consisting in:
a. defining a minimum time $t_s$, of condition of synchronization of the signals from the force sensor and the proximity sensor;
   i. defining a minimum threshold Vt of the signal measured on the force sensor;
   ii. scanning the signals from the force sensor and the proximity sensor as long as the distance measured by the proximity sensor is less than the distance defined in step i) and the effort $(V_1-V_0)>0$ and timing the time t of duration of step vii);
   iii. if, during step vii), the effort crosses the threshold and the time t crosses the threshold $t_s$, validating the touch and not validating the touch if the two conditions are not met.

This embodiment, particularly advantageous in the case where the touch surface is functionalized on a flexible material because it allows discriminating the voluntary touches from the inadvertent touches or signals generated by the deformation of the carrier substrate.

BRIEF DESCRIPTION OF THE DRAWINGS

The invention is exposed below according to its preferred, though non-limiting, embodiments, and with reference to FIGS. 1 to 9 in which.

The drawings are representations of principle and are not representative of the scale of the different components they represent.

DETAILED DESCRIPTION OF THE EMBODIMENTS

Throughout the text, the terms "flexible material" designate a product in the form of threads, rope, bands or sheet, of which at least one dimension is much greater than its thickness and which has a significant asymmetry between its tensile stiffness and its compressive or bending stiffness, according to stresses perpendicular to its thickness. It is typically a canvas, a strap or a lace, made of textile material consisting of natural or synthetic fibers, a polymer membrane, leather, paper or metals in very thin sheets, or straps of woody material, such as bamboo, jute or sisal.

As an indication, the tensile stiffness of such a product, or substrate, is at least 100 times greater than its compressive or bending stiffness. However, the person skilled in the art understand, in the light of the mentioned examples, that the compressive stiffness according to the thickness of the product is independent of its stiffness in the direction perpendicular to its thickness and that the stiffness according to the thickness of a such product can be very high.

Figure 2:
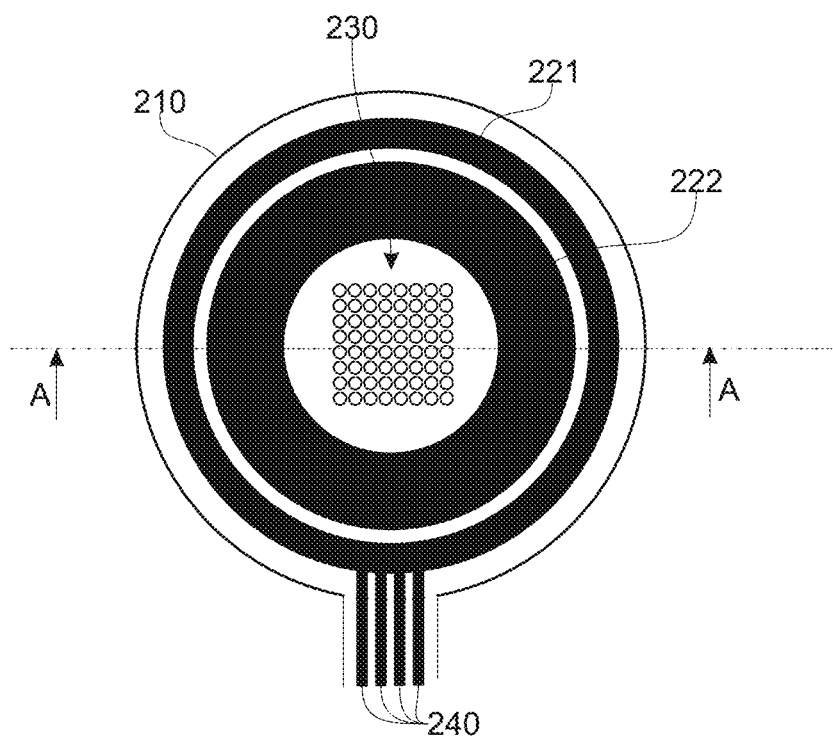
FIG. 2 shows in a top view, a first embodiment of an elementary combined sensor according to the invention.

FIG. 2 according to an exemplary embodiment, an elementary combined sensor implemented by the invention comprises an insulating substrate (210) on which concentric conductive tracks (221, 222), constituting a capacitive sensor, are deposited, by techniques known from the prior art.

The insulating substrate (210) is, according to exemplary embodiments, a polymer, for example a polyimide or a PET, or a ceramic, according to the targeted application.

For the application preferentially targeted by the invention, said substrate (210) consists of a flexible polymer film.

Said concentric tracks (221, 222) are for example made of copper, ITO ($In_2O_3$—$SnO_2$) to produce a transparent sensor or any other conductive material.

They are deposited, for example, by photolithography or by soft lithography.

In the center of the sensor, an assembly of nanoparticles constituting a force sensor is deposited.

According to an exemplary embodiment, suitable for producing a transparent sensor, said nanoparticles are ITO nanoparticles in colloidal suspension in an insulating ligand, for example an (aminomethyl) phosphonic acid ($CH_6NO_3P$).

According to other exemplary embodiments, the nanoparticles are zinc oxide (ZnO) nanoparticles or gold (Au) nanoparticles.

The assembly of nanoparticles (230) is a monolayer or multilayer assembly, deposited on the substrate, for example, by convective capillary deposition or by a method called "drop evaporation" as described in the document EP 2 877 911, without these examples being exhaustive or limiting.

The assembly of nanoparticles (230) is firmly linked to the substrate (210), for example via a chemical coupler.

By way of example, the chemical coupler is a silane ($SiH_4$), capable of interacting with OH groups on the surface of the substrate which is previously activated by UV-Ozone treatment and including, at the other end of the coupler, a carboxylic group (COOH) capable of being grafted onto an amine group ($NH_2$) previously grafted to the surface of the nanoparticles.

The assembly of nanoparticles (230) constitutes a strain gauge, whose electrical conductivity varies depending on the relative distance between the nanoparticles of the assembly.

This variation in conductivity or conversely in electrical resistance is attributed to conduction by the tunnel effect between the nanoparticles, and this effect provides a very high gauge factor, much higher than what is possible to obtain with a piezoresistive film, which allows measuring very small deformations.

For example, the proportional variation in the resistance of such an elementary force sensor, consisting of an assembly of ITO nanoparticles in a ligand based on phosphonic acid, reveals an exponential evolution of the response depending on the deformation undergone by said elementary sensor, with a gauge factor reaching the value of 85 over a deformation range of −1%, in compression, at +1% in tension for a resistance in the range of $2000 \cdot 10^3$ Ohm in the absence of deformation.

Thus, this elementary force sensor is very sensitive and allows to detect a pressure or touch force, even relatively weak, applied to said sensor, which can thus constitute its own test body. In other words, the ability to detect the applied force is not related to the deformability of the substrate. Thus, the deformation of the substrate is not necessary to detect an applied force and the arrangement represented in FIG. 2 can be made on a very rigid substrate such as silicon dioxide ($SiO_2$) or silicon nitride ($Si_3N_4$) while allowing a measurement of the force applied to the sensor. Conversely, the substrate (210) can be made of a flexible material.

Conductive tracks (240), represented herein according to a principle representation, also deposited on the substrate (210), allow the power supply and the collection of data from the capacitive sensor and from the force sensor.

Figure 3:
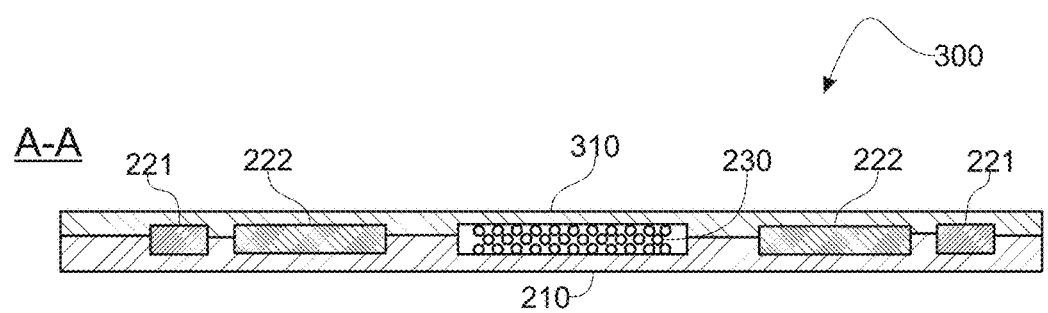
FIG. 3 is a sectional view AA of the sensor of FIG. 2 according to a section defined on this same view.

FIG. 3, a protective layer (310) consisting of an insulating material, for example a polyimide, or a PET for the production of a transparent sensor, is deposited on the sensor thus created.

According to this exemplary embodiment, the combined elementary sensor (300) has a diameter comprised between 10 mm and 30 mm and a thickness comprised between 50 µm and 300 µm without these values being limiting.

Figure 4:
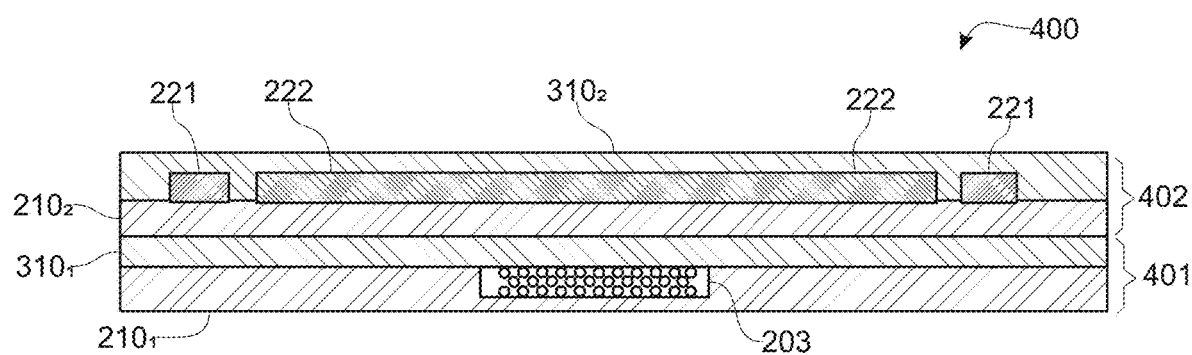
FIG. 4 represents another embodiment of an elementary combined sensor according to the invention according to a sectional view as FIG. 3.

FIG. 4, according to another embodiment, the combined elementary sensor (400) is produced in 2 layers (401, 402), the first layer (401) comprising, according to this embodiment, a first insulating substrate ($210_1$) on which the force sensor (230) is deposited according to a technology identical to what has been exposed above, and a first protective layer ($310_1$), and superimposed on this first layer (401), a second layer (402) comprising a second insulating substrate ($210_2$) on which second conductive tracks (221, 222), producing the capacitive sensor, are deposited.

A second protective layer ($310_2$) is placed on said capacitive sensor. According to the principles previously exposed, first conductive tracks are also deposited on the first insulating substrate ($210_1$), enabling power supply to and data collection from the force sensor, and third conductive tracks are deposited on the second insulating substrate ($210_2$), enabling power supply to and data collection from the capacitive sensor.

Figure 5A:
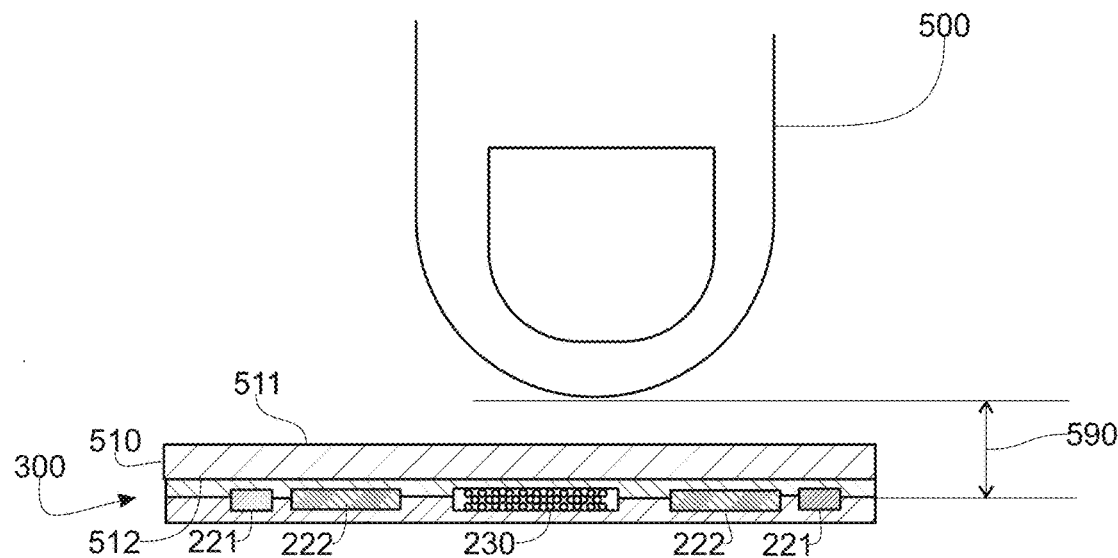
FIG. 5A to FIG. 5D illustrate the implementation of an elementary sensor for the detection of a touch, the measurement of the touch force, FIG. 5A, according to a sectional view during the proximity detection, FIG. 5B according to a sectional view during touch, FIG. 5C, the temporal evolution of the signal from the force sensor, processed depending on the time information of the signal from the capacitive sensor FIG. 5D.

FIG. 5A, for the production of a touch surface, the combined elementary sensor (300) described above, according to any one of its embodiments, is directly mounted on one face (512) of an insulating substrate (510), called carrier substrate, the opposite face (511) of said substrate being exposed to the touch.

Thus, the surface (511) of this substrate (510) is functionalized and allows detecting a touch on this surface (511) and measuring the force of application of this touch, whereas the sensor(s) as defined above are attached to said carrier substrate (510), on its face (512) which is opposite to its face exposed to the touch (511).

According to non-limiting exemplary embodiments, said carrier substrate (510) consists of a polymer, glass, ceramic, leather or wood. The sensitivity of the force sensor allows detecting a slight deformation, and thus detecting and measuring a touch force even if this substrate is rigid in the direction of its thickness.

According to a preferred exemplary embodiment, the carrier substrate (510) is made of a flexible material. In this case, the assembly consisting of the carrier substrate (510) and the sensor (300) are deformed either under the effect of the touch or under the effect of external stresses other than voluntary touch. The operation under these conditions is explained with reference to FIG. 9.

FIG. 5A, whether the carrier substrate (510) is rigid or made of a flexible material, when an electrically conductive object, for example a finger (500), is approached to the surface (511) thus functionalized, at a time to, its presence is detected, even before there is contact, as soon as it is at a distance which is less than or equal to a minimum distance (590) from the capacitive sensor.

This minimum distance (590) is adjustable according to the characteristics of the sensor and a threshold $C_0$ defined on the signal output by said capacitive sensor.

By way of example, the minimum distance is selected at any value between 0 and 10 mm according to the targeted application.

To this end, the sensor which is the subject of the invention is connected to an electronic circuit capable of carrying out these functions as well as the steps of the method set out below.

Figure 5B:
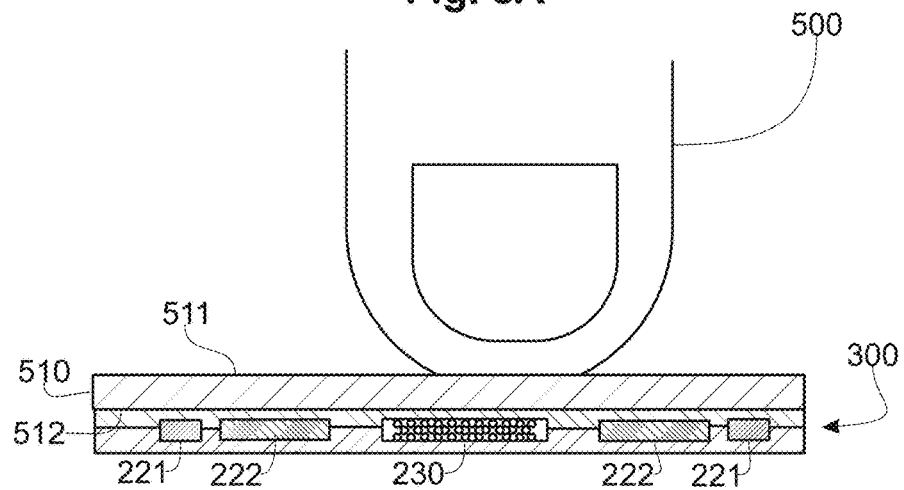
Figure 5C:
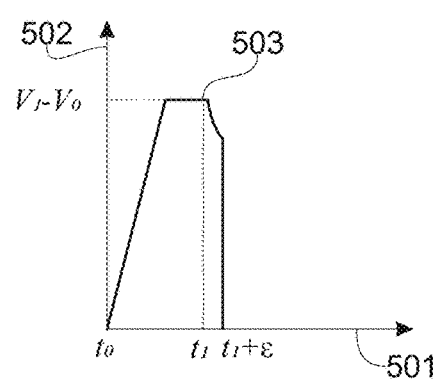
Figure 5D:
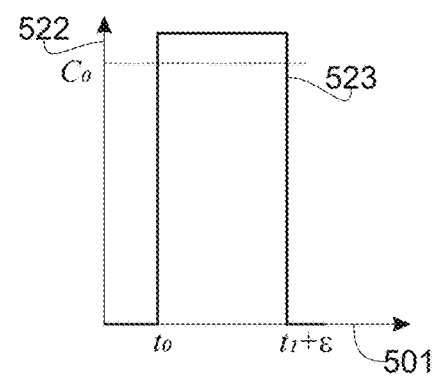

Thus, at the time to, FIG. 5D, by observing the value of the signal (522) output by the capacitive sensor as a function of time (501), the information (523) delivered by said sensor crosses the threshold $C_0$ corresponding to crossing the minimum distance (590). Then, as soon as the object (500) comes into contact with the surface, the information delivered by the capacitive sensor changes no more or very little, even if the applied pressure increases.

Returning to FIG. 1, when the proximity of the object (500) is detected, the value $V_0$ output by the force sensor at the time to is measured and taken as the reference value, by matching, at this value, a force equal to 0, since there is no contact, as shown in FIG. 5C, which represents the value (502) of the signal (503) output by the force sensor as a function of time (501), changed by the processing.

Thus, any phenomenon of drift of the information delivered by the force sensor, in particular due to temperature variations, is compensated.

The same applies when the carrier substrate (510) consists of a flexible material, and when the latter is deformed in any manner before the contact of the finger with the surface exposed to the touch (511). This arbitrary deformation of the carrier substrate (510) which the elementary sensor (300) also undergoes has an influence on the value $V_0$ output by the force sensor (230), an influence which is added to the drift of the sensor and to the influence of the environmental conditions such as temperature.

FIG. 5B, when the object (500) comes into contact with the functionalized surface (511) and applies a touch force thereon, the conductivity of the force sensor is changed proportionally to the applied force, and said force sensor delivers, FIG. 5C, an information item $V_1$ corresponding to a force proportional to $V_1-V_0$, corrected by the initial drift value $V_0$ of the force sensor (230).

When the touch pressure is released at the time $t_1$, at a short time ($t_1+e$) following this release, the object (500) is at a distance from the surface exposed to touch (511), which is greater than or equal to the minimum distance (590), and, FIG. 5D, the information delivered by the capacitive sensor crosses the threshold $C_0$ in the opposite direction.

When the crossing of this threshold $C_0$ is detected on the capacitive sensor, the information delivered by the force sensor is considered equal to 0. Thus, the return delayed to 0 of the information delivered by the force sensor, due to the hysteresis phenomena, is also masked.

Figure 1:
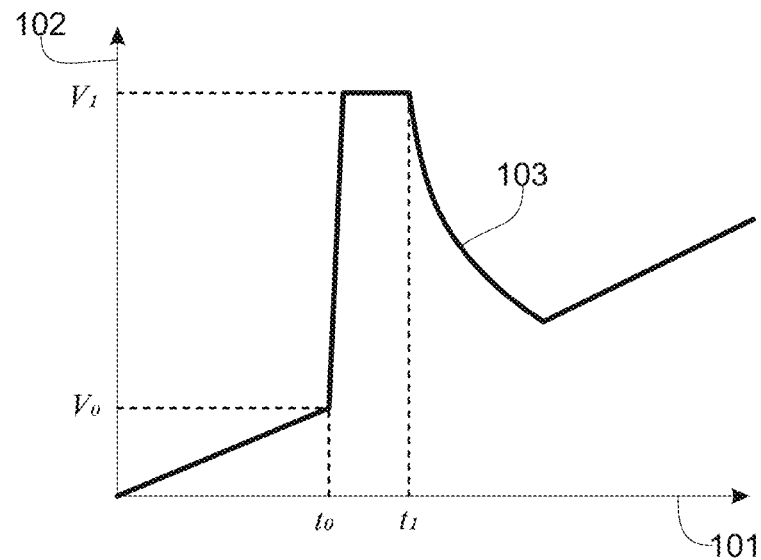
FIG. 1 relating to the prior art shows the temporal response of a force sensor implementing an assembly of nanoparticles whose conductivity varies according to the force applied to said sensor.

Thus, the combined use of the force sensor and the capacitive sensor allows measuring an applied force, and if necessary triggering actions depending on the level of this force, by eliminating the drift and hysteresis phenomena inherent in this type of force sensor and as represented FIG. 1, as well as the possible prior deformation of the substrate (510) when the latter is made of a flexible material.

FIG. 5A and FIG. 5B represent a functionalized surface comprising a combined elementary sensor (300) according to the first embodiment thereof. The person skilled in the art understands that the same principles are applicable in the case of a combined sensor (400) corresponding to the embodiment represented FIG. 4.

Figure 6:
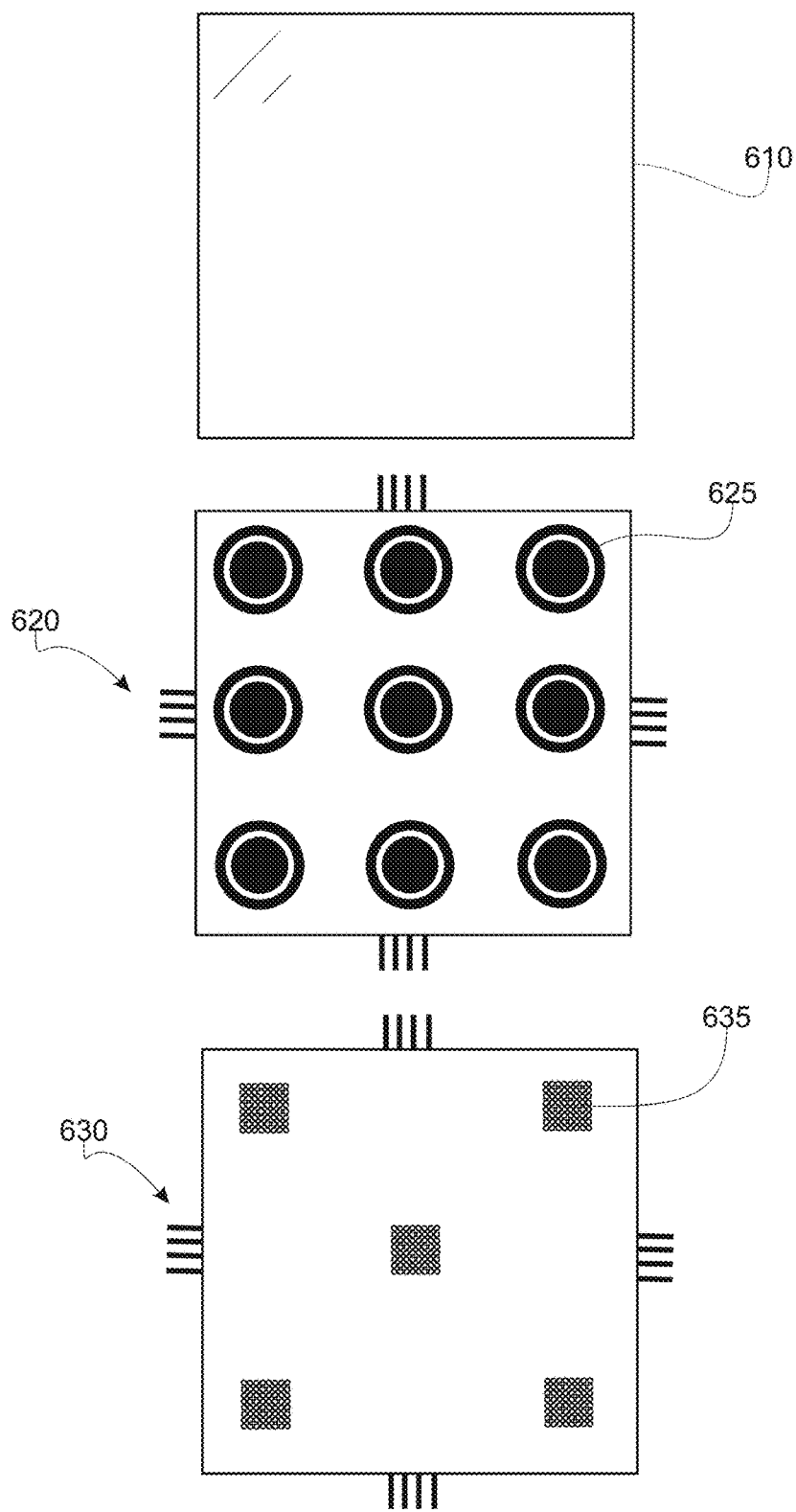
FIG. 6 represents, in an exploded top view, an embodiment of a touch surface combining a plurality of elementary sensors according to the invention.

FIG. 6, a plurality of elementary sensors are associated in a grid, so as to form a touch surface capable of detecting a touch, its location on the grid and the exerted pressure force.

FIG. 6 represents an embodiment combining a plurality of sensors (400) according to the embodiment represented FIG. 4. A person skilled in the art adapts this principle to the embodiment of the elementary sensor (300) shown FIG. 3.

Said touch surface comprises a carrier substrate (610), made of an electrically insulating material, and including a surface exposed to touch.

On the face opposite to this surface exposed to the touch of the carrier substrate (610) is added a first layer (620) comprising a grid of capacitive sensors (625), such as the upper layer (402) of the elementary sensor (400) according to the embodiment represented FIG. 4.

Under the layer (620) carrying the grid of capacitive sensors, is directly mounted a layer (630) comprising a grid of force sensors (635) made up of assemblies of nanoparticles, such as the lower layer (401) of the elementary sensor (400) according to the embodiment represented FIG. 4.

According to a first exemplary embodiment (not represented), the number of force sensors (635) is equal to the number of capacitive sensors (625) and said force sensors are located centered relative to the capacitive sensors. This embodiment is preferred, but not exclusive, when the carrier substrate (610) is made of a flexible material.

According to another embodiment, the number of force sensors (635) is reduced relative to the number of capacitive sensors (625) and said force sensors are located centered, or not, relative to said capacitive sensors.

This embodiment, using a reduced number of force sensors, is more economical and better suited, but not exclusive, to the case of a carrier substrate (610) which is rigid, including in the direction of the thickness.

According to this embodiment, regardless of the point of application of the touch force on the touch surface thus created, the touch effort is evaluated, knowing this point of application, and deduced from the signals output by one of the force sensors, for example the one closest to the point of application, or by combining the information delivered by several of these sensors, at least 3 force sensors for a flat touch surface, according to implementation variants.

The location of the point of application of the touch on the touch surface is obtained from the grid of capacitive sensors (625).

This principle remains valid in the event of multiple touch points.

This embodiment allows producing a touch surface comprising a high density of capacitive sensors, more economical to produce than the force sensors, and thus obtaining an accurate location of the point(s) of application of the touch, then evaluating the force applied during these touches by an appropriate processing of the information delivered by a reduced number of force sensors (635), more expensive to produce, depending on the location of the point(s) of application of the touch.

The implemented method remains similar, namely that as soon as the proximity of a conductive object is detected at a distance which is less than or equal to the minimum distance (590, FIG. 5A) from one of the capacitive sensors, the value $V_0$ output by each of the force sensors is measured so as to reset the information delivered by each of said sensors, the application effort is determined by combining the information from said force sensors depending on the location of the point of application of the effort given by the network of capacitive sensors, then, when the object moves away from the touch surface by a distance which is greater than or equal to the minimum distance, the force is reset to 0.

The person skilled in the art understands that the use of a reduced number of force sensors relative to the number of capacitive sensors is applicable to a touch surface of shape other than flat, for example a single or double curved surface, as long as this form is stable.

For a flexible touch surface of variable shape, for example a touch surface applied to clothing, the embodiment, comprising a number of force sensors equivalent to that of the capacitive sensors and centered relative thereto, is preferable.

Thus, the device of the invention offers, in its variants, very varied application possibilities.

Whether the functionalization of the surface of the carrier substrate (510, 610) is performed according to the embodiment shown FIG. 5A or according to the embodiment shown FIG. 6, the device of the invention does not require any support other than those shown in these figures for its operation. In particular, it is neither useful nor necessary for the stack made of the network of elementary sensors, such as described FIG. 3 and FIG. 4, and the carrier substrate (510, 610) to be deposited on a specific support, in particular a rigid support or one of stable shape. It is sufficient, for a force to be measured, that a reaction force is produced during the touch. This reaction force is for example produced due to the variation in tension in the flexible carrier substrate, or the reaction produced by a soft tissue of the user, for example on an arm or on a leg, or even by the reaction of the foam of a piece of furniture, and of course by the reaction of a rigid support.

Figure 7:
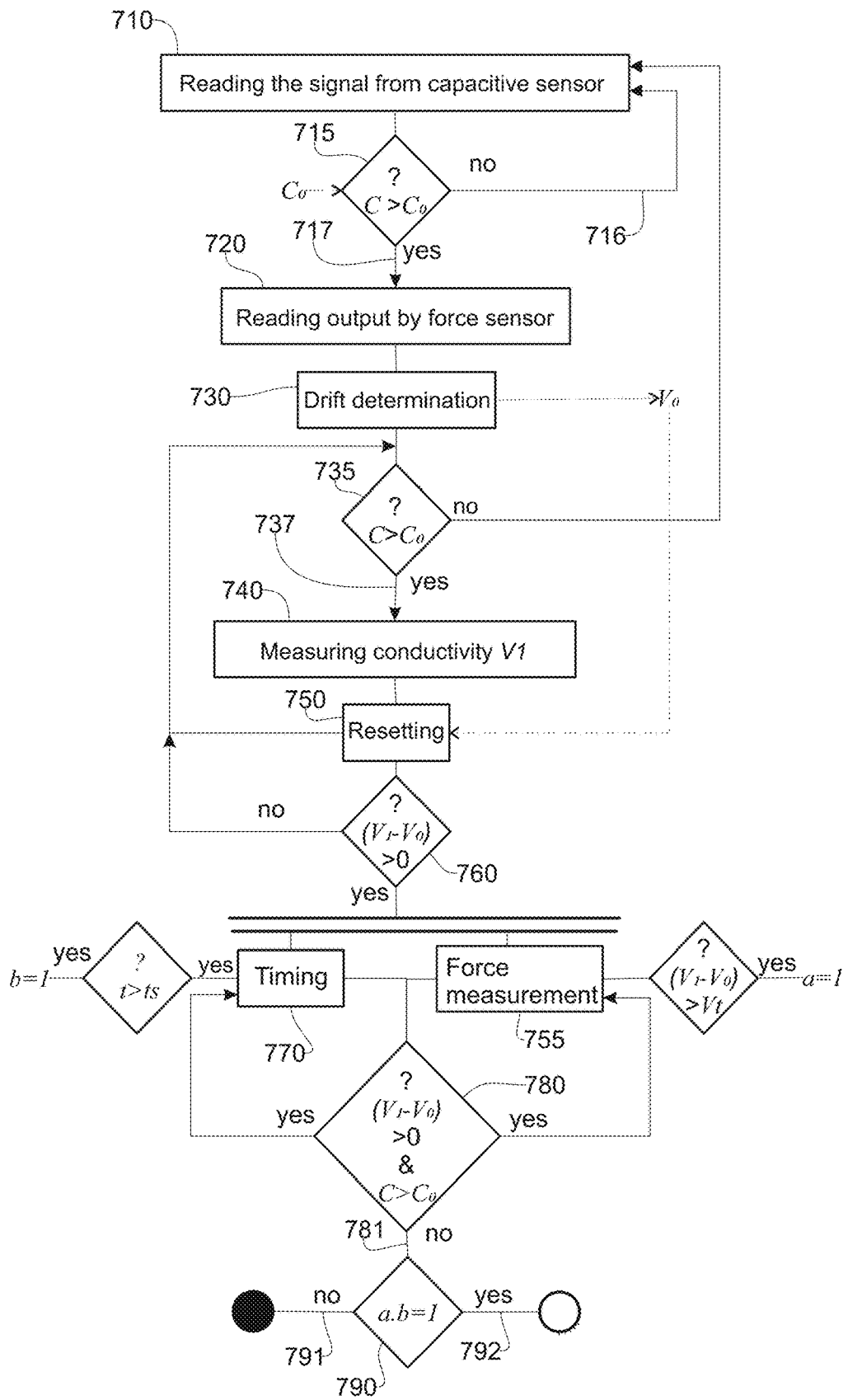
FIG. 7 shows the flowchart of an example of a method implementing an elementary sensor according to the invention.

FIG. 7, the implementation of the method of the invention at the scale of an elementary sensor, regardless of the embodiment of this sensor, comprises, according to a frequency or by to a defined time interval, the reading (710) of the signal originating from the capacitive sensor and the comparison (715) of the value of the signal thus read with a defined value $C_0$ representative of a minimum distance between an object and the capacitive sensor.

According to this exemplary embodiment, and with reference to FIGS. 5A and 5D, when this distance is less than or equal to a minimum distance, the signal output by the capacitive sensor is greater than or equal to a value $C_0$.

In the case (716) where the signal output by the capacitive sensor remains lower than $C_0$, no other action is triggered and the scanning of the signal at the frequency or by given time interval continues.

In the case (717) where the signal output by the capacitive sensor crosses the threshold $C_0$ and therefore that an object is located in the vicinity of said sensor, during steps of initializing the force sensor, the unloaded conductivity value output by the force sensor is read (720) and during a drift determination step (730) the value thus read ($V_0$) is used as a reference value.

The measurement of the applied force is carried out relative to this reference as long as the object is in contact with the touch surface. To this end, the output signal from the capacitive sensor is compared (735) with the value $C_0$ corresponding to the minimum distance, and as long as (737) the value output by this sensor remains greater than the value $C_0$, the loaded conductivity signal originating from the force sensor is measured (740) and, during a resetting step (750), corrected relative to the value $V_0$ determined during the drift determination step (730) carried out in the same acquisition sequence.

The described method FIG. 7 in the case of an elementary sensor, extends to the case of a touch surface comprising as many elementary sensors, with additional steps consisting in locating, on the grid of capacitive sensors, the one where the proximity is detected, and depending on this information, applying the steps of reading the delivered information (720), of drift measurement (730), of measuring the force applied (740) and of resetting (750) to the force sensor which is closest to the capacitive sensor for which the touch proximity is detected.

Figure 8:
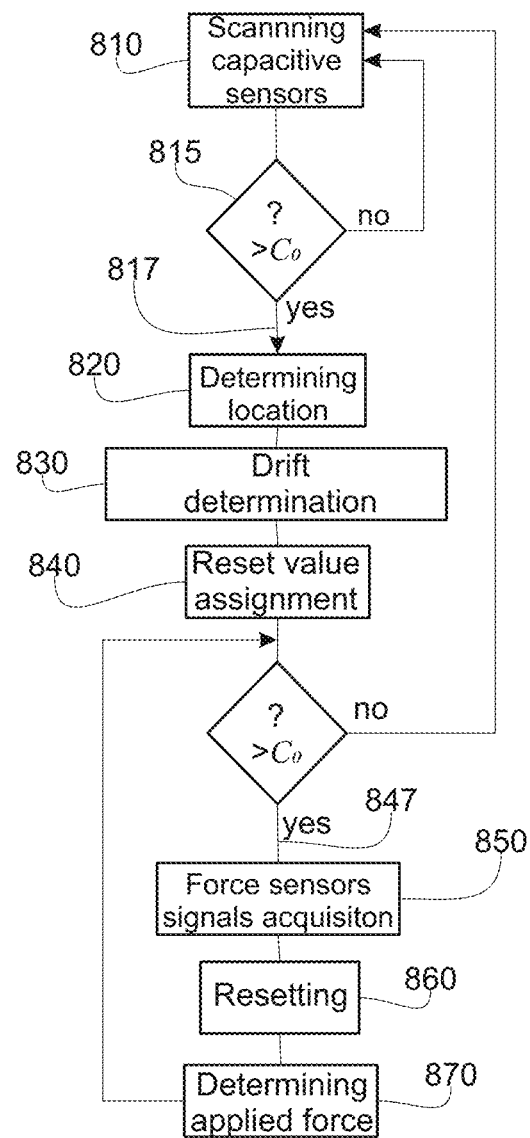
FIG. 8 is an example of a flowchart of a method implementing a touch surface according to the invention.

FIG. 8, in the case where the touch surface comprises a much significant density of capacitive sensors compared to the number of force sensors, during a scanning step (810), the information delivered by the capacitive sensors is probed at regular time intervals and the information delivered by each sensor is compared (815) to the value $C_0$ corresponding to the minimum distance threshold.

When this threshold is crossed (817) on one of the sensors, during a location step (820), the position of the activated capacitive sensor is determined.

During a drift determination step (830), the unloaded conductivity measurement delivered form each of the force sensors is read and this information is assigned (840) to each of the respective force sensors as a resetting reference value.

Throughout the touch (847), the loaded conductivity measurement originating from the force sensors is acquired (850), corrected in a resetting step (860) for each sensor by the reference value evaluated during the drift determination step (830).

Then, depending on the point of application of the force, determined during the location step (820), the force applied to the point considered is estimated (870) by combining the information from the force sensors.

More particularly, but not exclusively, when the functionalized surface is carried by a flexible material, events measured on the sensors are likely to be confused with voluntary actions, such as a touch at one or more points, initiated by the user of the device including a surface functionalized according to the invention.

Figure 9:
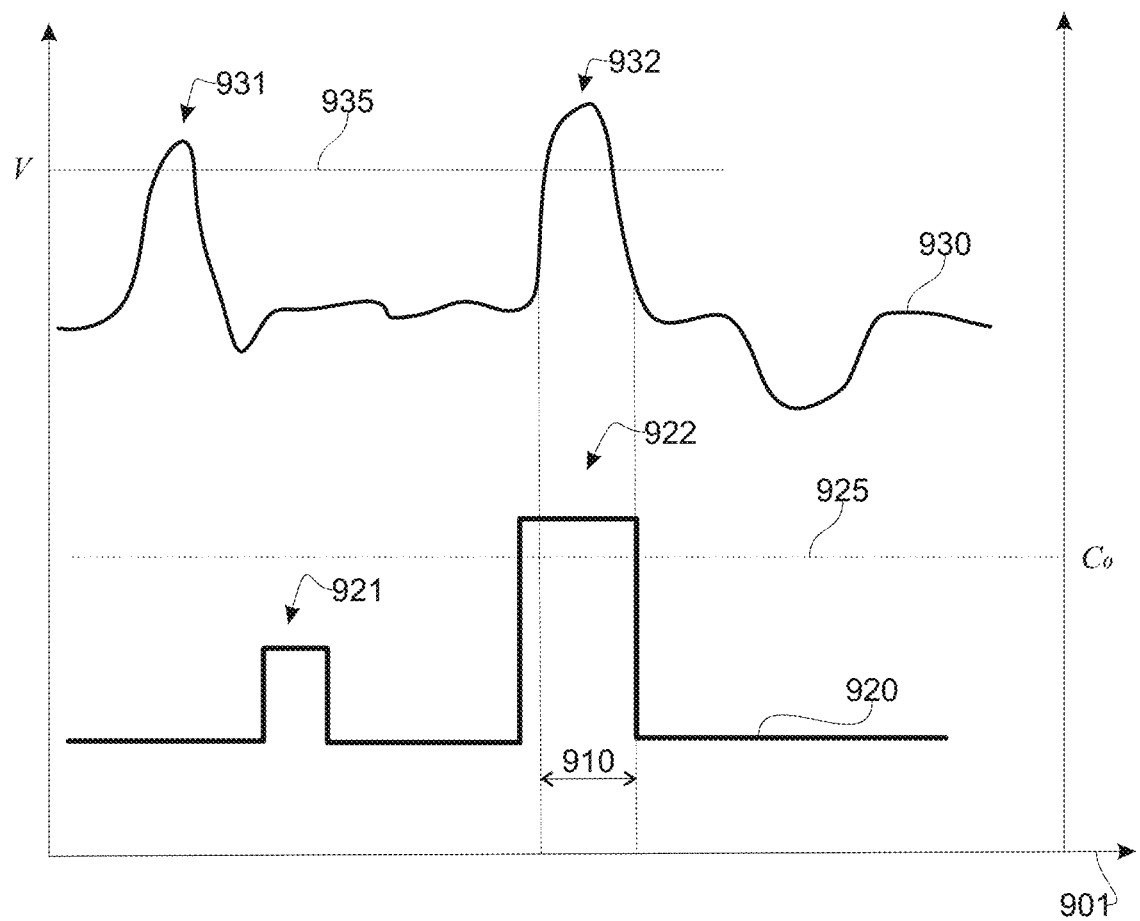
FIG. 9 is an example of a diagram of temporal evolution of the signals output by the force sensor and the proximity sensor.

FIG. 9, by way of example the signal (930) from the force sensor as a function of time (901), reveals an event (931) which does not correspond to a voluntary action and which is, for example, generated by a deformation of the touch surface. Another event (932) also measured on the signal output by the force sensor corresponds to a touch of the touch surface during a voluntary action by the user.

The two events taken individually cannot be dissociated from each other even with reference to a threshold crossing V (935).

On this same time diagram, the signal (920) from the capacitive proximity sensor shows an unintentional event (921) corresponding, for example, to an untimely touch of the functionalized surface, and a voluntary event (922) corresponding to a touch initiated by the user, in this case the same touch as that (932) detectable on the signal (930) coming from the force sensor.

As in the case of the signal from the force sensor, the signal (920) from the proximity sensor, taken alone, does not allow differentiating an information item resulting from an involuntary event (921), from that resulting from a voluntary event (922) by crossing the threshold $C_0$ (925).

The person skilled in the art understands that in this FIG. 9, the resetting of the force signal in response to the information delivered by the proximity sensor has not been represented in order simplify the representation, but will adapt the principles set out below in the presence of resetting of the force signal.

However, the combination of the information (920) delivered by the proximity sensor and that (930) delivered by the force sensor allows discriminating between these situations.

In the [Table 1] below, $F>V_t$ means that the signal (930) output by the force sensor is greater than a threshold $V_t$ (935) that is to say that the intensity of the force acting on said sensor is greater than a defined threshold. $C>C_0$ means that the signal (920) output by the proximity sensor is greater than a threshold $C_0$ (925) and that the object contacting or about to contact the touch surface is at a distance which is less than a threshold distance of said touch surface.

The cases are even better discriminated by adding the analysis of the temporal occurrence, depending on whether the events (922, 932) on the signals from the proximity sensor and from the force sensor occur in the same time slot, and are called "synchronous", or that said events (921, 931) occur one after the other and are then called "non-synchronous".

[Table 1] classifies the different cases in the following manner:
A: unintentional or inadvertent touch
B: deformation of the carrier substrate without touch
C: Synchronous signals: invalid intentional touch
D: Synchronous signals: valid intentional touch
In the cases C and D if the signals are not synchronous, it is a succession of inadvertent touch and deformation of the support.

From a practical point of view, the signals from the proximity sensor and from the force sensor are synchronous when they are measured simultaneously at non-zero values for a duration (910) which is greater than a determined duration $t_s$.

Hence [Table 1] which shows that among all possible cases, only one (case D) corresponds to a valid touch, provided that the signals are synchronous.

TABLE 1

| Prox. | $C<C_0$ | $C>C_0$ | $C=0$ | $C=0$ | $C<C_0$ | $C<C_0$ | $C>C_0$ | $C>C_0$ |
|---|---|---|---|---|---|---|---|---|
| Force. | $F=0$ | $F=0$ | $F<V_t$ | $F>V_t$ | $F<V_t$ | $F>V_t$ | $F<V_t$ | $F>V_t$ |
| Case | A | A | B | B | C | C | C | D |

Thus, returning to FIG. 7, the implementation of the validation of a voluntary touch, implies the definition of the values of $V_t$, defining the minimum effort threshold and of the minimum interaction time $t_s$. These values are functions of the targeted application and of the nature of the touch surface and, according to refinements, may be dependent on other measured variables such as the temperature. From a practical point of view they are, for example, determined by tests (just like $C_0$)

According to an exemplary embodiment, the method represented in FIG. 7 remains identical up to the measuring (740) and resetting steps.

The value $F=(V_1-V_0)$ of the effort signal is compared (760) to 0 and if the signal $(V_1-V_0)$ is non-zero, then a process aiming at validating the presence of a touch is launched.

During this process, as long as (780) the signals output by the force sensor and the proximity sensor are non-zero, that is to say that an object is in contact with the touch surface, the contact time t of this object is timed (770), and the effort is measured (755).

If at a given time, the measured force reaches or crosses the threshold value $V_t$ then a Boolean variable a, initialized to 0 is set to 1, attesting that during this process the force has crossed this threshold.

If the time t, timed during this process, crosses the time ts then a Boolean variable b initialized to 0 is set to 1.

When (781) the pressure of the object on the touch surface is released, which results in the condition $(V_1-V_0)=0$ or $C<C_0$, then the timing (770) is stopped and reset, as well as the force measurement.

If (790) the Boolean product a·b=1 then the signals issued by the force sensor and the proximity sensor have crossed the defined thresholds synchronously, corresponding to situation D of table 1, the touch is validated (792).

If the Boolean product a·b=0 then the situation corresponds to a situation A, B or C of table 1 and the touch is not validated (791).

The above description and the exemplary embodiments show that the invention achieves the targeted aim and that the combination of a capacitive sensor and a force sensor comprising an assembly of nanoparticles, implemented by the method of the invention allows functionalizing a surface in an economical manner to make a touch surface therefrom, detecting a touch of said surface, locating this touch on the surface and measuring the touch effort applied by resolving the insufficiencies of the prior art, in particular relating to the drift and hysteresis phenomena observed in the information delivered by the force sensors, and more particularly when the functionalized surface is carried by a flexible material.

The invention claimed is:

1. A touch surface comprising:
a carrier substrate comprising two opposite faces, a first face of the two opposite faces being exposed to a touch;
a second face of the two opposite faces which is opposite to the first face and comprising a combined sensor comprising:
a first insulating substrate;
a first layer comprising a force sensor comprising an assembly of conductive nanoparticles in colloidal suspension in an electrically insulating ligand, deposited on the first insulating substrate;
first conductive tracks deposited on the first insulating substrate and adapted to supply power and to collect information from the force sensor;
a first protective layer covering the force sensor;
a second layer superimposed on the first layer and comprising a second insulating substrate and second conductive tracks configured to make a capacitive sensor, deposited on the second insulating substrate;
third conductive tracks deposited on the second insulating substrate and adapted to supply power and to collect information from the capacitive sensor; and
a second protective layer covering the capacitive sensor.

2. The touch surface of claim 1, wherein the first insulating substrate and the second insulating substrate are made of polyimide.

3. The touch surface of claim 1, wherein the carrier substrate is made of a rigid material selected among a wood, a glass and a ceramic.

4. The touch surface of claim 1, wherein the first insulating substrate and the second insulating substrate are made of PET, the conductive nanoparticles are made of tin-doped indium oxide, the electrically insulating ligand is an (aminomethyl) phosphonic acid, the first conductive tracks, the second conductive tracks and the third conductive tracks are made of tin-doped indium oxide.

5. The touch surface of claim 1, wherein the carrier substrate is made of a flexible material.

6. The touch surface of claim 5, wherein the flexible material is selected among a textile, a membrane polymer, paper and leather.

7. The touch surface of claim 1, comprising a plurality of capacitive sensors and a plurality of force sensors, wherein a total number of force sensors in the plurality of force sensor is equal to a total number of capacitive sensors in the plurality of capacitive sensors.

8. The touch surface of claim 1, comprising a plurality of capacitive sensors and a plurality of force sensors, and wherein a total number of capacitive sensors in the plurality of capacitive sensors is greater than a total number of force sensors in the plurality of force sensors.

9. A method for detecting and measuring an intensity of a touch force exerted by an electrically conductive object on the touch surface of claim 7 or claim 8, comprising steps of:
  i. adjusting a sensitivity of the plurality of capacitive sensors so as to detect a defined distance between one capacitive sensor and the electrically conductive object;
  ii. when the electrically conductive object is detected by the one capacitive sensor at a distance which is less than or equal to the defined distance, measuring an unloaded conductivity of one force sensor and taking a value thus measured as a reference value V0;
  iii. when the touch force is applied to the touch surface by means of the electrically conductive object, measuring a loaded conductivity V1 of the one force sensor and deducing an intensity of the touch force therefrom by difference with the reference value V0 determined in step ii) (V1−V0) to obtain a corrected value and outputting a force intensity value of corresponding to the intensity of the touch force and computed from the corrected value; and
  iv. when the touch force exerted by the electrically conductive object on the touch surface is released and when the distance detected by the one capacitive sensor becomes greater than or equal to the defined distance, outputting the force intensity value equal to 0.

10. The method of claim 9, wherein step ii) comprises determining a location on the touch surface of a point of application of the touch force exerted by the electrically conductive object on the touch surface, comprising:
  determining a location at a time where the one capacitive sensor of the plurality of capacitive sensors is at the distance with the electrically conductive object equal or less than the defined distance;
  measuring the unloaded conductivity of each force sensor of the plurality of force sensors at this time and taking the values thus measured as the reference values for each force sensor of the plurality of force sensors; and wherein step iii) comprises:
    determining the intensity of the touch force exerted by the electrically conductive object on the touch surface by determining the loaded conductivity of each force sensor of the plurality of force sensors, each loaded conductivity being corrected by the reference values and combining the corrected values according to the location determined at the time.

11. The method of claim 9, comprising:
  v. defining a minimum time threshold ts, as a condition of synchronization of signals outputted from the one force sensor and the one capacitive sensor;
  vi. defining a minimum threshold Vt on a signal outputted by the one force sensor;
  vii. scanning the signals outputted by the plurality of force sensors and the plurality of capacitive sensors as long as the distance from the electrically conductive object to the one capacitive sensor is less than the defined distance and (V1−V0)>0 and timing a time t of duration during which these two conditions are met; and
  viii. if during step vii), (V1−V0) crosses the minimum threshold Vt and the time t of duration crosses the minimum time threshold ts, validating the touch and not validating the touch if one of the minimum threshold Vt and the minimum time threshold ts is not crossed.

* * * * *